United States Patent
Kondo

(10) Patent No.: US 11,598,820 B2
(45) Date of Patent: Mar. 7, 2023

(54) LOAD TESTING DEVICE

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 5 days.

(21) Appl. No.: 17/604,453

(22) PCT Filed: Feb. 13, 2020

(86) PCT No.: PCT/JP2020/005451
§ 371 (c)(1),
(2) Date: Oct. 18, 2021

(87) PCT Pub. No.: WO2020/225953
PCT Pub. Date: Nov. 12, 2020

(65) Prior Publication Data
US 2022/0146578 A1    May 12, 2022

(30) Foreign Application Priority Data

May 7, 2019  (JP) .............................. JP2019-087900
Dec. 16, 2019  (JP) .............................. JP2019-226234

(51) Int. Cl.
*G01R 31/42*    (2006.01)

(52) U.S. Cl.
CPC .................................... *G01R 31/42* (2013.01)

(58) Field of Classification Search
CPC .......... H02J 50/12; H02J 7/04; H02J 2310/14; H02J 50/50; H02J 7/0068; H02J 7/007182;
(Continued)

(56) References Cited

U.S. PATENT DOCUMENTS 8,482,158 B2 *  7/2013  Kurs ..................... H01F 38/14
                                              307/104
9,727,068 B2 *  8/2017  Kamel ............. H02J 13/00022
(Continued)

FOREIGN PATENT DOCUMENTS

JP   2010-25752 A   2/2010
JP   2018-91650 A   6/2018
(Continued)

OTHER PUBLICATIONS

International Search Report issued in PCT/JP2020/005451 dated Mar. 24, 2020 with English Translation (5 pages).
(Continued)

*Primary Examiner* — Vinh P Nguyen
(74) *Attorney, Agent, or Firm* — Nakanishi IP Associates, LLC

(57) ABSTRACT

A load testing device includes: a resistance unit; a cooling fan that cools the resistance unit; a circuit breaker; a first terminal part that is connected to a test target power source; and a charge/discharge unit that has a charger and a first power storage device. The charge/discharge unit is connected with a test target power source cable being between the first terminal part and the resistance unit, between the first terminal part and the circuit breaker. The first power storage device $45a$ stores electric power supplied from the test target power source. The cooling fan drives based on electric power from at least the charge/discharge unit.

8 Claims, 13 Drawing Sheets

(58) Field of Classification Search
CPC .... H02J 7/00309; H02J 3/322; H02J 2310/64; H02J 2310/48; H02J 2310/60; H02J 7/00302; H02J 9/061; H02J 7/00047; H02J 3/00; H02J 7/007194; H02J 7/0049; H02J 3/46; H02J 9/062; H02J 1/00; H02J 7/0031; H02J 13/0004; H02J 7/007; H02J 9/06; G05F 1/10; G05F 1/66; G05F 1/67; G06F 1/26; G06F 1/3206; G01R 31/3274; G01R 31/3278; G01R 21/133; G01R 31/327; G01R 21/00; G01R 21/06; G01R 22/06; G01R 19/16542; G01R 22/063; G01R 31/34; G01R 31/14; G01R 31/3835; G01R 31/385; G01R 31/386; G01R 31/40; G01R 19/00; G01R 19/003; G01R 19/2513; G01R 31/00; G01R 31/50; G01R 31/42
See application file for complete search history.

(56) References Cited

U.S. PATENT DOCUMENTS

| | | | |
|---|---|---|---|
| 10,976,369 B2* | 4/2021 | Kondo | .................. G01R 31/40 |
| 2019/0326778 A1 | 10/2019 | Kondo | |

FOREIGN PATENT DOCUMENTS

| WO | 2014/162678 A1 | 10/2014 |
|---|---|---|
| WO | 2015/125182 A1 | 8/2015 |
| WO | 2015/125183 A1 | 8/2015 |
| WO | 2017/017975 A1 | 2/2017 |
| WO | 2018/225152 A1 | 12/2018 |

OTHER PUBLICATIONS

Notification of Reasons for Refusal issued in Japanese Patent Application No. 2020-520828 dated Jul. 31, 2020 with English Translation (9 pages).

Decision to Grant Patent issued in Japanese Patent Application No. 2020-520828 dated Aug. 24, 2020, with English Translation (5 pages).

Written Opinion of International Searching Authority issued in PCT/JP2020/005451 dated Mar. 24, 2020 (8 pages).

Office Action issued in Chinese Patent Application No. 202000168222 dated Mar. 16, 2022 and Search Record dated Mar. 9, 2022, with English Translation (22 pages).

Office Action issued in Chinese Patent Application No. 202080016822.2 dated Oct. 8, 2022 with English Translation (18 pages).

Extended European Search Report issued in European Patent Application No. 20801435.7 dated Dec. 22, 2022 (9 pages).

* cited by examiner

LOAD TESTING DEVICE

TECHNICAL FIELD

The present invention relates to a load testing device.

BACKGROUND ART

Conventionally, a load testing device including a plurality of resistor groups has been proposed as in Patent Literature 1.

CITATION LIST

Patent Literature

Patent Literature 1: JP 2010-25752 A

SUMMARY OF INVENTION

Technical Problem

However, it was necessary to prepare an ancillary power source different from the test target power source in order to supply electric power to the electric equipment constituting the load testing device such as a cooling fan.

Accordingly, it is an object of the present invention to provide a load testing device capable of a load test without preparing an ancillary power source and without stopping a cooling fan and the like.

Solution to Problem

A load testing device according to the present invention includes a resistance unit, a cooling fan that cools the resistance unit, a circuit breaker, a first terminal part that is connected to a test target power source, and a charge/discharge unit that has a charger and a first power storage device. The charge/discharge unit is connected with a test target power source cable being between the first terminal part and the resistance unit, between the first terminal part and the circuit breaker. The first power storage device stores electric power supplied from the test target power source. The cooling fan drives based on electric power from at least the charge/discharge unit.

The electric equipment constituting the load testing device such as the cooling fan and the control unit drives based on the electric power or the like from the charge/discharge unit including the first power storage device storing the electric power from the test target power source.

Therefore, it is possible to conduct a load test without requiring preparation of an ancillary power source different from the test target power source in order to drive the electric equipment constituting the load testing device.

As a part of the load in the load test, it is possible to use the charge/discharge unit.

Even when the power supply from the test target power source is interrupted, the power supply from the first power storage device makes it possible to continue the operation of the electric equipment constituting the load testing device such as the cooling fan and the control unit.

Since the charge/discharge unit is connected to the test target power source cable between the first terminal part and the circuit breaker, it becomes possible to maintain power supply from either the test target power source or the first power storage device to the cooling fan even in a case where the circuit breaker is brought into an off state and no power is supplied to the resistance unit.

Preferably, the cooling fan supplies cooling air to the resistance unit and the charge/discharge unit. The test target power source is an alternating-current power source. The charge/discharge unit has a first conversion unit that converts the electric power from the test target power source from alternating current to direct current, and converts the electric power from the first power storage device from direct current to alternating current. The first power storage device performs charging based on electric power from the test target power source via the first conversion unit and the charger. The cooling fan drives based on electric power from the test target power source, and drives based on electric power from the first power storage device via the charger and the first conversion unit.

More preferably, the test target power source is a three-phase alternating-current power source. The charge/discharge unit has a first transformer in which one terminal on an input side is connected to a U-phase line and the other terminal on the input side is connected to a V-phase line, and a second transformer in which one terminal on the input side is connected to a V-phase line and the other terminal on the input side is connected to a W-phase line. Power supply from the test target power source to the first conversion unit is performed based on electric power stepped down by the first transformer and the second transformer.

This makes it possible to conduct a load test using a cooling fan and the like that is not compatible with a high-voltage power source, in a high-voltage load testing device.

More preferably, the load testing device further includes a second terminal part that is connected to an external device separate from the load testing device. The external device connected to the second terminal part drives based on electric power from the first power storage device via the charger when the cooling fan is in the off state.

It is possible to operate the external device of the load testing device connected to the second terminal part based on the power supply from the test target power source or the first power storage device.

More preferably, the load testing device further includes a display unit. The display unit outputs information regarding whether the cooling fan is driving based on electric power from the test target power source or driving based on electric power from the charge/discharge unit.

More preferably, information regarding whether the cooling fan is driven based on electric power from the test target power source or is driving based on electric power from the charge/discharge unit is transmitted to a mobile terminal separate from the load testing device.

Preferably, the load testing device further includes a load resistance. The charge/discharge unit has a first switching relay. The first switching relay is used for switching a supply destination of electric power from the test target power source between the charger and the load resistance.

Since the load resistance is provided, it is possible to make the electric load of the load testing device constant between at the time of charging and at the time when it is not necessary to charge because of full charge (at the time of non-charging).

More preferably, the charge/discharge unit has a second power storage device, a second switching relay, and a third switching relay. The second power storage device stores electric power supplied from the test target power source. The second switching relay is used for switching the supply destination of electric power from the test target power source between the first power storage device and the second power storage device. The third switching relay is used for switching whether electric power to the cooling fan is supplied from the first power storage device or supplied from the second power storage device.

Since the cooling fan is driven based on electric power supplied from the power storage device (either the first power storage device or the second power storage device), rather than directly based on electric power supplied from the test target power source, it is possible to reduce the possibility of the cooling fan being momentarily stopped even if the power supply from the test target power source to the load testing device is stopped.

Two power storage devices (the first power storage device and the second power storage device) are provided. When one (the first power storage device) is charged, the other (the second power storage device) is discharged. When the other is charged, the one is discharged. Therefore, it is possible to reduce the load on the power storage device as compared with a form in which one power storage device performs power storage and discharge.

More preferably, the load testing device further includes a display unit. The display unit outputs information regarding whether the electric power from the test target power source is supplied to the load resistance or supplied to the charger, and information regarding whether the cooling fan is driving based on electric power from the first power storage device or driving based on electric power from the second power storage device.

Preferably, information regarding whether the electric power from the test target power source is supplied to the load resistance or supplied to the charger, and information regarding whether the cooling fan is driving based on electric power from the first power storage device or driving based on electric power from the second power storage device are transmitted to the mobile terminal separate from the load testing device.

Preferably, a plurality of cooling fans is provided. The plurality of charge/discharge units is provided for use as uninterruptible devices for the plurality of cooling fans and for supplying electric power to each of the plurality of cooling fans. The plurality of cooling fans cools the resistance unit.

Since the resistance unit is cooled by the plurality of cooling fans, a smaller cooling fan can be used for each of said plurality of cooling fans as compared with a form in which the resistance unit is cooled by one cooling fan. A plurality of charge/discharge units is provided corresponding to the plurality of small cooling fans. Therefore, it is possible to use a power storage device and a charger having a smaller capacity for each of said plurality of charge/discharge units as compared with a form in which a plurality of cooling fans is driven by one charge/discharge unit. The use of a small-capacity power storage device and a charger makes it possible to complete charging and discharging in a shorter time as compared with a form in which a large-capacity power storage device and charger are used.

More preferably, the plurality of cooling fans is controlled in accordance with the state of the resistance unit.

Advantageous Effects of Invention

As described above, according to the present invention, it is possible to provide a load testing device capable of a load test without preparing an ancillary power source and without stopping a cooling fan and the like.

DESCRIPTION OF EMBODIMENTS

Figure 1:
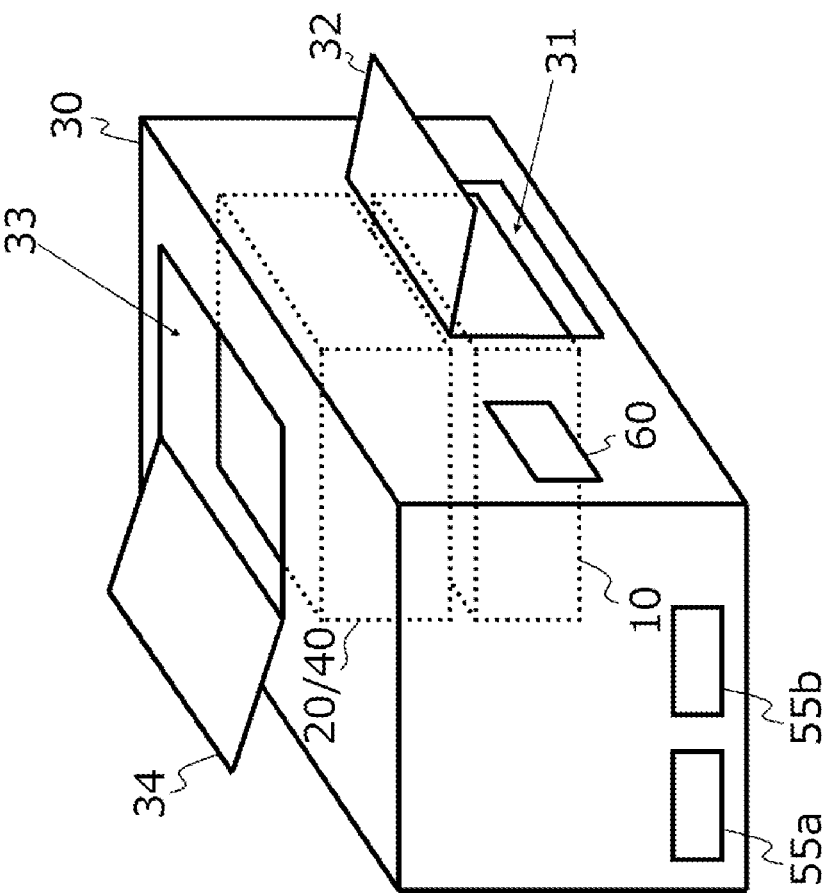
FIG. 1 is a perspective view showing a configuration of a load testing device in a first embodiment.

The first embodiment will be described below with reference to the drawings.

The embodiments are not limited to the following embodiments. The contents described in one embodiment are applied also to other embodiments in principle. The embodiments and modifications can be combined as appropriate.

A load testing device 1 in the first embodiment includes a cooling fan 10, a resistance unit 20, a housing 30, a charge/discharge unit 40, a circuit breaker 50, a first terminal part 55*a*, a second terminal part 55*b*, an operation unit 60, and a control unit 80.

The load testing device 1 is used for conducting a load test of a power source device (test target power source) such as a three-phase alternating-current generator (see FIG. 1 to FIG. 5).

(Cooling fan 10)

The cooling fan 10 is a device that supplies cooling air to the resistance unit 20 and the charge/discharge unit 40, and the resistance unit 20 and the charge/discharge unit 40 are arranged above the cooling fan 10 (downstream of air discharged from the cooling fan 10) (see FIG. 1).

That is, the resistance unit 20 and the charge/discharge unit 40 are provided on a flow path through which cooling air from the cooling fan 10 passes.

Figure 2:
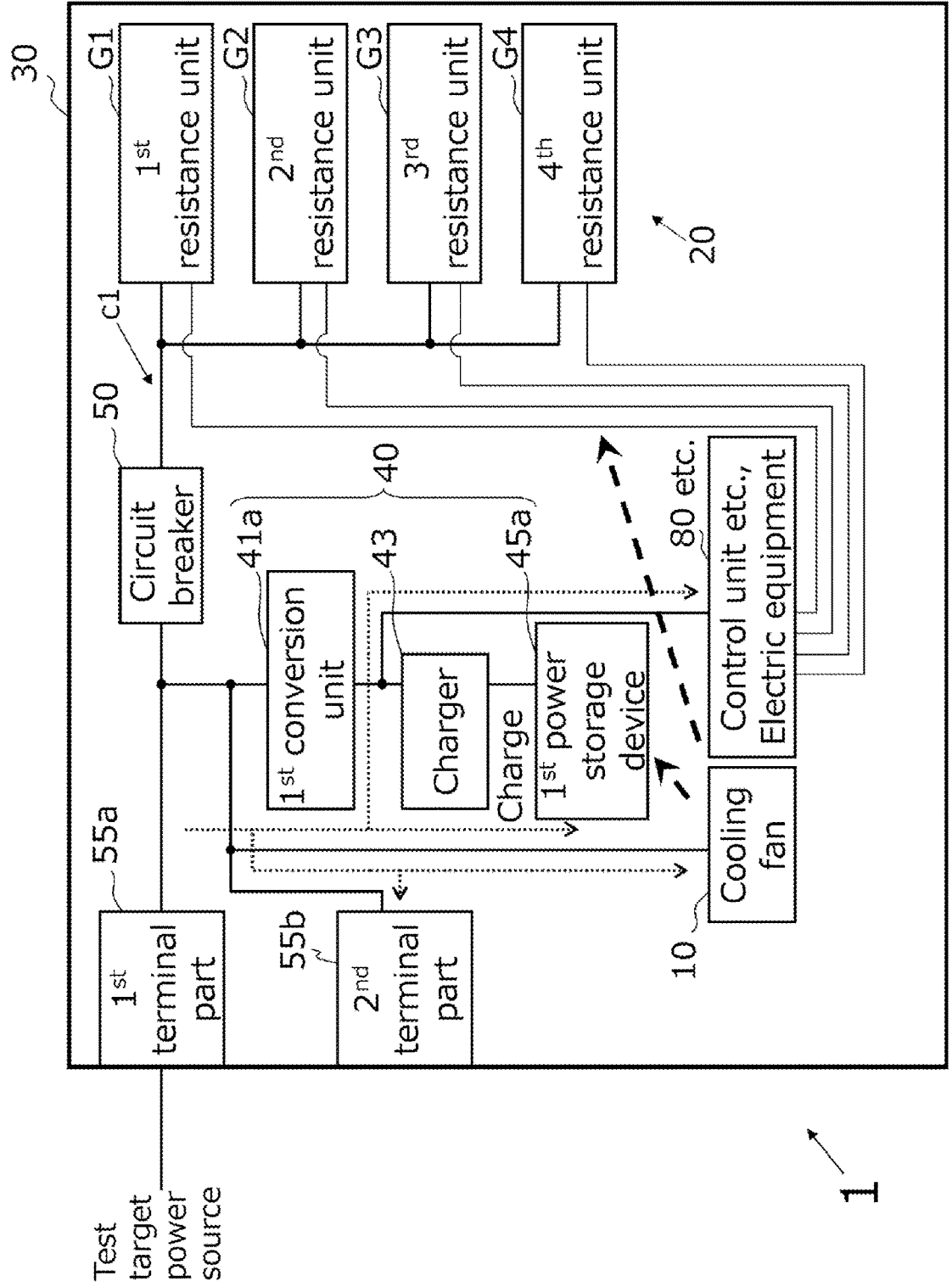
FIG. 2 is a schematic view showing a circuit configuration of a charge/discharge unit and a resistance unit in the first embodiment, and shows a flow of electricity during charging.

The cooling fan 10 is driven based on electric power from the test target power source (see FIG. 2).

Figure 3:
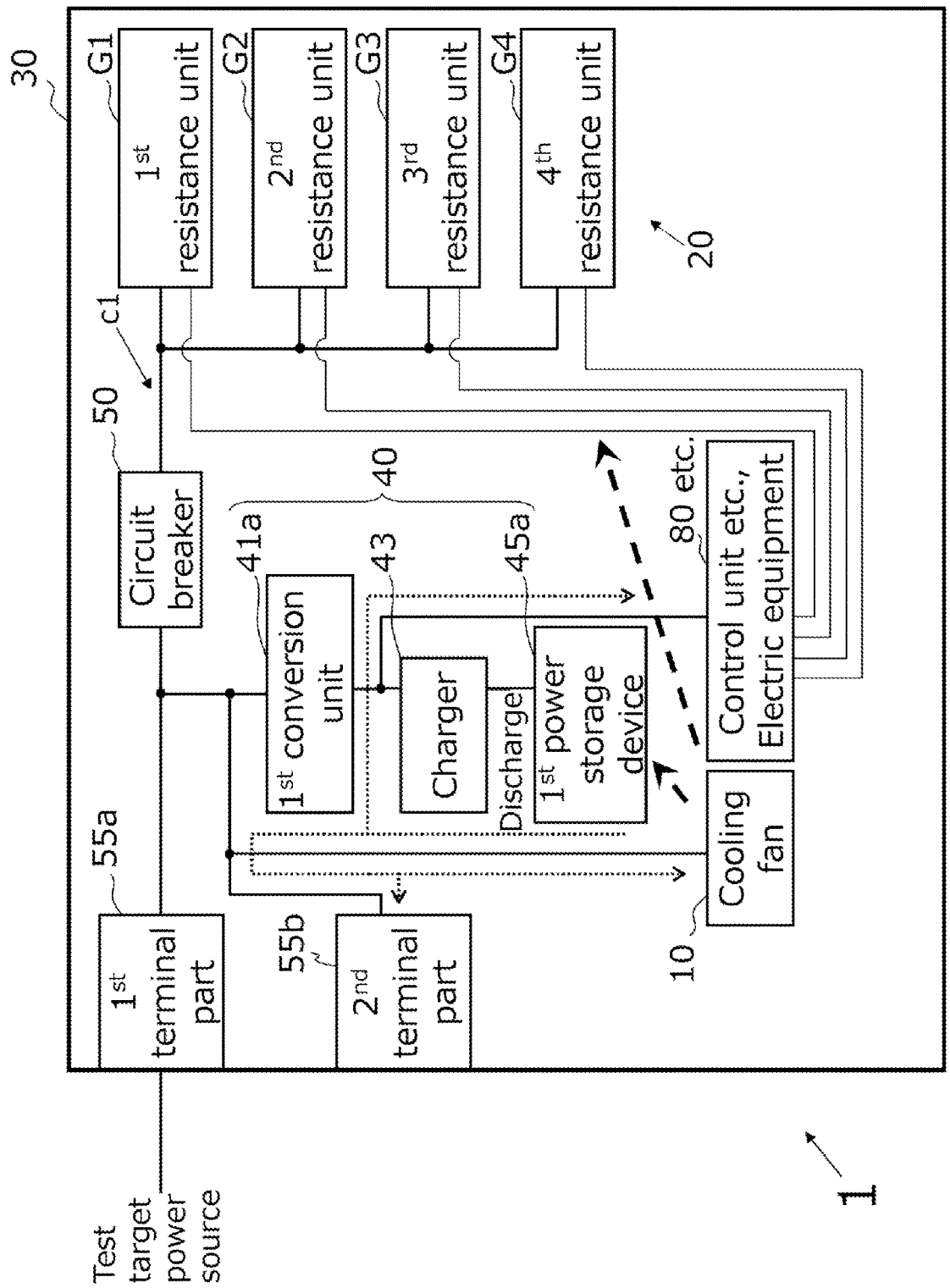
FIG. 3 is a schematic view showing a circuit configuration of the charge/discharge unit and the resistance unit in the first embodiment, and shows a flow of electricity during discharging.
Figure 4:
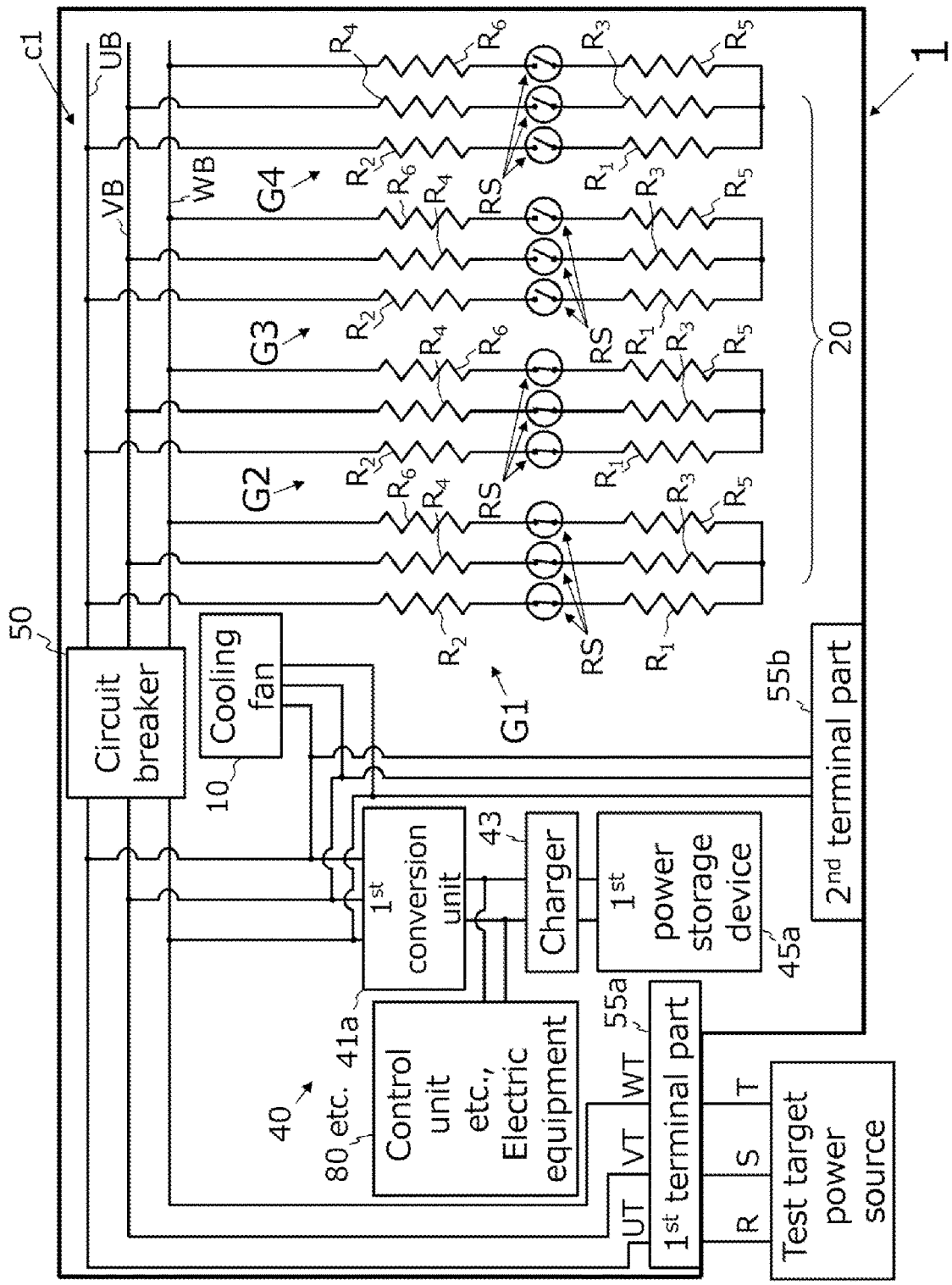
FIG. 4 is a schematic view showing a detail of the circuit configuration of the charge/discharge unit and the resistance unit in the first embodiment.

However, in a case where the power supply from the test target power source is small, the cooling fan 10 is driven based on electric power from a first power storage device 45a via a charger 43 and a first conversion unit 41a (see FIG. 3). That is, the cooling fan 10 is driven based on electric power at least from the charge/discharge unit 40.

In FIG. 2, the direction in which electricity flows from the test target power source to the cooling fan 10 and the like is indicated by a dotted arrow, and the direction in which cooling air flows from the cooling fan 10 to the resistance unit 20 and the like is indicated by a broken arrow.

In FIG. 3, the direction in which electricity flows from the first power storage device 45a to the cooling fan 10 and the like is indicated a dotted arrow, and the direction in which cooling air flows from the cooling fan 10 to the resistance unit 20 and the like is indicated by a broken arrow.

In the first embodiment, the description will be made on an assumption that the cooling fan 10 is driven by alternating current. Therefore, the cooling fan 10 is connected to a line on an alternating current line, for example, a line between the first terminal part 55a and the first conversion unit 41a.

However, the cooling fan 10 may be driven by direct current. In this case, the cooling fan 10 is connected to a line on a direct current line, for example, a line between the first conversion unit 41a and the charger 43.

(Resistance Unit 20)

The resistance unit 20 is provided with one or more resistor groups which includes rod-shaped or the like resistors arranged at predetermined intervals and connected in series or in parallel. Electric power from the test target power source is supplied to some or all of said resistor groups in case of load test (see FIG. 4).

The resistor is not limited to one composed of an electric heating wire, and may be one capable of storing electric power therein, such as a battery.

In the first embodiment, it is shown an example is that a total of four resistor groups of two resistor groups having a rated capacity of 5 kW (a first resistor group G1 and a second resistor group G2) and two resistor groups having a rated capacity of 10 kW (a third resistor group G3 and a fourth resistor group G4) are provided, for load testing of a three-phase alternating-current power source.

Each resistor group is provided with two resistors (a first resistor $R_1$ and a second resistor $R_2$) connected in series for the U-phase connecting to an R-phase terminal of the test target power source, two resistors (a third resistor $R_3$ and a fourth resistor $R_4$) connected in series for the V-phase connecting to an S-phase terminal of the test target power source, and two resistors (a fifth resistor $R_5$ and a sixth resistor $R_6$) connected in series for the W-phase connecting to a T-phase terminal of the test target power source.

In each resistor group, relays RS are provided between the first resistor $R_1$ and the second resistor $R_2$, between the third resistor $R_3$ and the fourth resistor $R_4$, and between the fifth resistor $R_5$ and the sixth resistor $R_6$.

The relay RS is controlled on/off in accordance with an on/off operation of a first switch S1 to a fourth switch S4 described later, and brings it into a state where a current flows through the corresponding resistor group when the relay RS is in an on state.

The relay RS may be a three-way switch in which a U-phase relay, a V-phase relay, and a W-phase relay operate on/off in an interlocking manner, or may be a single-way switch in which each relay operates on/off independently.

One terminal of the second resistor $R_2$ in each resistor group is connected to a U-phase line UB extending from a U-phase terminal UT of the first terminal part 55a connecting to the R-phase terminal of the test target power source, of a cable (test target power source cable) c1 electrically connecting the first terminal part 55a and the resistance unit 20.

One terminal of the fourth resistor $R_4$ in each resistor group is connected to a V-phase line VB extending from a V-phase terminal VT of the first terminal part 55a connecting to the S-phase terminal of the test target power source, of the test target power source cable c1.

One terminal of the sixth resistor $R_6$ in each resistor group is connected to a W-phase line WB extending from a W-phase terminal WT of the first terminal part 55a connecting to the T-phase terminal of the test target power source, of the test target power source cable c1.

One terminal of the first resistor $R_1$, one terminal of the third resistor $R_3$, and one terminal of the fifth resistor $R_5$ in each resistor group are short-circuited.

The other terminal of the first resistor $R_1$ in each resistor group is connected to the other terminal of the second resistor $R_2$ via the relay RS.

The other terminal of the third resistor $R_3$ in each resistor group is connected to the other terminal of the fourth resistor $R_4$ via the relay RS.

The other terminal of the fifth resistor $R_5$ in each resistor group is connected to the other terminal of the sixth resistor $R_6$ via the relay RS.

Note that the number of resistor groups, the rated voltage and rated capacity of each resistor group, and the number of resistors in the resistor group are not limited to those in the above-described configuration.

(Housing 30)

The housing 30 is a case that holds members constituting the load testing device 1 such as the cooling fan 10, the resistance unit 20, the charge/discharge unit 40, the circuit breaker 50, the first terminal part 55a, the second terminal part 55b, the operation unit 60, and the control unit 80, excluding a mobile terminal 90 described later.

In the housing 30, an intake port 31 is provided on a side surface (upstream) below the cooling fan 10, and an exhaust port 33 is provided above (downstream) the resistance unit 20 and the charge/discharge unit 40 (see FIG. 1).

The intake port 31 is provided with an intake lid 32 that opens when used and closes when not used, and the exhaust port 33 is provided with an exhaust lid 34 that opens when used and closes when not used.

In the first embodiment, the intake lid 32 and the exhaust lid 34 are each configured by a swing door through a hinge, but may be configured by another door structure such as a sliding door.

Furthermore, at least one of the intake lid 32 and the exhaust lid 34 may be omitted.

(Charge/Discharge Unit 40)

The charge/discharge unit 40 in the first embodiment includes the first conversion unit 41a, the charger 43, and the first power storage device 45a.

The charge/discharge unit 40 is used as an uninterruptible device for the electric equipment constituting the load testing device 1 such as the cooling fan 10, the operation unit 60 and the control unit 80.

The first conversion unit 41a functions as an AC/DC converter at the time of charging, and converts the electric power supplied from the test target power source from alternating current to direct current.

The first conversion unit 41a functions as a DC/AC inverter at the time of discharging, and converts the electric power supplied from the first power storage device 45a from direct current to alternating current.

The input side of the first conversion unit 41a as an AC/DC converter is connected to the U-phase line UB, the V-phase line VB, and the WB-phase line WB between the first terminal part 55a and the circuit breaker 50.

The output side of the first conversion unit 41a as an AC/DC converter is connected to the charger 43 and the electric equipment constituting the load testing device 1 such as the operation unit 60 and the control unit 80.

The first conversion unit 41a may be configured by integrating a portion functioning as an AC/DC converter and a portion functioning as a DC/AC converter, or may be configured by having them as separate bodies.

The first conversion unit 41a may have a DC/DC converter for adjusting the voltage applied to the charger 43.

The charger 43 has a charge circuit that charges the first power storage device 45a.

The first power storage device 45a is a device that stores electric power supplied from the test target power source, such as a battery.

When the voltage applied to the first power storage device 45a becomes lower than the discharge voltage of the first power storage device 45a, the first power storage device 45a is switched from the charge state (see FIG. 2) to the discharge state (see FIG. 3).

When the discharge voltage of the first power storage device 45a becomes equal to or lower than the voltage applied to the first power storage device 45a, the first power storage device 45a is switched from the discharge state (see FIG. 3) to the charge state (see FIG. 2).

However, switching between charge and discharge of the first power storage device 45a may be performed based on the control of the control unit 80 or the like.

When electric power is supplied from the test target power source to the load testing device 1, the first conversion unit 41a converts electric power supplied from the test target power source from alternating current to direct current, and the first power storage device 45a performs charging.

Furthermore, electric power is supplied via the first conversion unit 41a to the electric equipment constituting the load testing device 1 such as the operation unit 60 and the control unit 80.

When electric power is not supplied from the test target power source to the load testing device 1, the first conversion unit 41a converts electric power supplied from the first power storage device 45a from direct current to alternating current, and the electric power is supplied to the cooling fan 10.

(Circuit Breaker 50)

The circuit breaker 50 is composed of a molded case circuit breaker (MCCB), a vacuum circuit breaker (VCB), or the like. The circuit breaker 50 is provided between the resistance unit 20 and the first terminal part 55a, and is provided on the test target power source cable c1 (on the U-phase line UB, on the V-phase line VB, and on the W-phase line WB). When the circuit breaker 50 is in the on state, electric power from the test target power source is supplied to the resistance unit 20, and when the circuit breaker 50 is in the off state, power supply from the test target power source to the resistance unit 20 is stopped.

The charge/discharge unit 40 is electrically connected to the test target power source cable c1 between the first terminal part 55a and the circuit breaker 50.

(First Terminal Part 55a)

The first terminal part 55a is connected to the circuit breaker 50 and the first conversion unit 41a inside the load testing device 1, and is connected to the test target power source outside the load testing device 1.

The first terminal part 55a has the U-phase terminal UT, the V-phase terminal VT, and the W-phase terminal WT.

The U-phase terminal UT is connected to the U-phase line UB and the R-phase terminal of the test target power source, the V-phase terminal VT is connected to the V-Phase line VB and the S-phase terminal of the test target power source, and the W-phase terminal WT is connected to the W-phase line WB and the T-phase terminal of the test target power source.

(Second Terminal Part 55b)

The second terminal part 55b is connected to the test target power source cable c1 and the first conversion unit 41a inside the load testing device 1, and is connected to an external device separate from the load testing device 1.

Said external device connected to the second terminal part 55b is driven based on electric power from the test target power source via the test target power source cable c1, and is also driven based on electric power from the first power storage device 45a via the charger 43 and the first conversion unit 41a.

However, said external device connected to the second terminal part 55b may be supplied with electric power only from the first power storage device 45a via the charger 43 and the first conversion unit 41a, and may not be supplied with power from the test target power source via the test target power source cable c1.

An interlock circuit (not illustrated) may be provided between the second terminal part 55b and the cooling fan 10, and only when the cooling fan 10 is in the off state, the interlock circuit may perform power supply to said external device connected to the second terminal part 55b. In this case, when the power supply from the test target power source is interrupted, the electric power necessary for maintaining the drive of the cooling fan 10 can be left in the first power storage device 45a.

The electric power supplied to the second terminal part 55b is not limited to three-phase alternating current, but may be single-phase alternating current or direct current. In this case, the second terminal part 55b is provided with a circuit that converts three-phase alternating current into single-phase alternating current (or direct current).

(Operation Unit 60)

The operation unit 60 is provided with an on/off operation switch 60a that bringing the power source of the load testing device 1 into the on state or the off state, a selection switch 60b (a first switch S1, a second switch S2, a third switch S3, and a fourth switch S4) for adjusting the load amount (for selecting a resistor group that supplies electric power from the test target power source), and a display unit 60c that displays the operation state of the load testing device 1 and the operation state (whether charge or discharge and the like) of the first power storage device 45a.

When the main power source of the load testing device 1 is brought into the on state by operating the on/off operation switch 60a, the fan of the cooling fan 10 rotates based on electric power supplied from the test target power source, and sends the air taken in from the intake port 31 to the resistance unit 20 and the charge/discharge unit 40.

Based on electric power supplied from the test target power source, the first power storage device 45a stores electric power (see FIG. 2).

Based on electric power supplied from the test target power source, the operation unit 60, the control unit 80, and the like operate.

Based on electric power supplied from the test target power source, the external device connected to the second terminal part 55b operates.

When electric power is not supplied from the test target power source to the load testing device 1, the first power storage device 45a performs discharge.

Then, the cooling fan 10 operates based on electric power supplied from the first power storage device 45a via the charger 43 and the first conversion unit 41a (see FIG. 3).

The electric equipment constituting the load testing device 1 such as the operation unit 60 and the control unit 80 operates based on the electric power supplied from the first power storage device 45a via the charger 43.

The external device connected to the second terminal part 55b operates based on electric power supplied from the first power storage device 45a via the charger 43 and the first conversion unit 41a.

An on/off switch for the cooling fan 10 may be provided separately from the on/off operation switch 60a. In this case, rotation of the fan of the cooling fan 10 is started by operating said on/off switch for the cooling fan 10 in a state where the main power source of the load testing device 1 is brought into the on state by operating the on/off operation switch 60a.

The display unit 60c outputs information regarding the operation state of the load testing device 1, for example, whether the cooling fan 10 is driving based on electric power from the test target power source or driving based on electric power from the charge/discharge unit 40.

Specifically, the display unit 60c displays, for example, "power supply from the test target power source is present and the first power storage device is being charged", "power supply from the test target power source is present but the first power storage device is fully charged", "power supply from the test target power source is not present and the power storage device is driving the cooling fan and the like", and the like.

Figure 5:
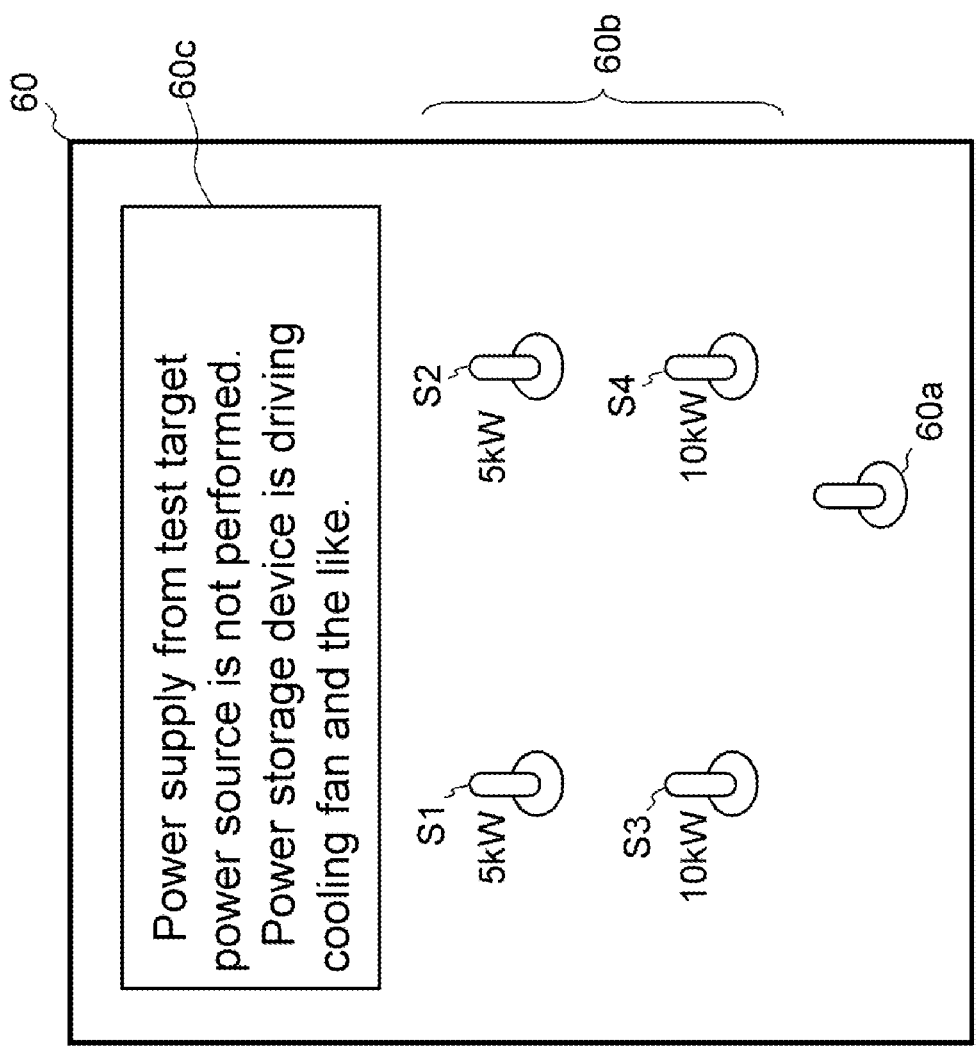
FIG. 5 is a schematic view showing a configuration of an operation unit in the first embodiment.

FIG. 5 shows an example of display "power supply from the test target power source is not performed and the first power storage device 45a is driving the cooling fan 10 and the like" as the operation state of the first power storage device 45a.

The operation state of the load testing device 1 and the operation state of the first power storage device 45a may not only displayed on the display unit 60c of the operation unit 60 of the load testing device 1, but may also be displayed on the mobile terminal 90 separate from the load testing device 1.

In this case, the mobile terminal 90 communicates with the control unit 80 and the like of the load testing device 1. Information regarding the operation state of the first power storage device 45a, for example, information regarding whether the cooling fan 10 is driving based on electric power from the test target power source or driving based on electric power from the charge/discharge unit 40, is transmitted to the mobile terminal 90.

(Control Unit 80)

The control unit 80 is a control device fixed to the inside of the housing 30 that holds the resistance unit 20.

The control unit 80 is a device that controls each unit of the load testing device 1 such as the relay RS, the cooling fan 10, and the circuit breaker 50.

(Operation Procedure of Relay RS During Load Test)

When the main power source of the load testing device 1 is brought into the on state, the circuit breaker 50 is brought into the on state.

By operating the selection switch 60b (the first switch S1 and the like), it becomes possible to carry current to the resistance unit 20.

Specifically, the control unit 80 brings into the on state the relay RS of the resistor group corresponding to the selection switch 60b with which current carrying is selected.

Thus, electric power is supplied from the test target power source connected via the circuit breaker 50 to the resistor group corresponding to the selection switch 60b with which current carrying is selected.

As a specific example, a procedure in which electric power is supplied when the first switch S1 and the second switch S2 are operated so as to be brought into the on state and the third switch S3 and the fourth switch S4 are operated so as to be brought into the off state will be described.

The control unit 80 brings into the on state the relay RS of the first resistor group G1 corresponding to the first switch S1 and the relay RS of the second resistor group G2 corresponding to the second switch S2.

Therefore, electric power is supplied to the first resistor group G1 and the second resistor group G2 from the test target power source connected via the circuit breaker 50.

The control unit 80 brings into the off state the relay RS of the third resistor group G3 corresponding to the third switch S3 and the relay RS of the fourth resistor group G4 corresponding to the fourth switch S4.

Therefore, electric power is not supplied to the third resistor group G3 and the fourth resistor group G4 from the test target power source connected via the circuit breaker 50.

However, the on/off control of the relay RS may be directly performed in accordance with the operation of the selection switch 60b not via the control unit 80.

(Effects)

In the first embodiment, the electric equipment constituting the load testing device 1 such as the cooling fan 10, the operation unit 60, and the control unit 80 drives based on the electric power or the like from the charge/discharge unit 40 including the first power storage device 45a storing the electric power from the test target power source.

Therefore, it is possible to conduct a load test without requiring preparation of an ancillary power source different from the test target power source in order to drive the electric equipment constituting the load testing device 1.

As a part of the load in the load test, it is possible to use the charge/discharge unit 40.

Even when the power supply from the test target power source is interrupted, the power supply from the first power storage device 45a makes it possible to continue the operation of the electric equipment constituting the load testing device 1 such as the cooling fan 10, the operation unit 60, and the control unit 80.

Since the charge/discharge unit 40 is connected to the test target power source cable c1 between the first terminal part 55a and the circuit breaker 50, it becomes possible to maintain power supply from either the test target power source or the first power storage device 45a to the cooling fan 10 even in a case where the circuit breaker 50 is brought into the off state and no power is supplied to the resistance unit 20.

It is possible to operate the external device of the load testing device 1 connected to the second terminal part 55b based on the power supply from the test target power source or the first power storage device 45a.

It becomes possible to output the operation status of the load testing device, in particular the charge status of the first power storage device 45a, to the display unit 60c and the mobile terminal, and to inform the user.

(Application to Single-Phase Alternating-Current or Direct-Current Test Target Power Source)

In the first embodiment, the test target power source is a three-phase alternating-current power source, but the test target power source may be a single-phase alternating-current power source or a direct-current power source.

When the test target power source is a direct-current power source, the cooling fan 10 is driven by direct current, and the first conversion unit 41a is omitted.

(Application to High-Voltage Load Testing Device 1)

Figure 6:
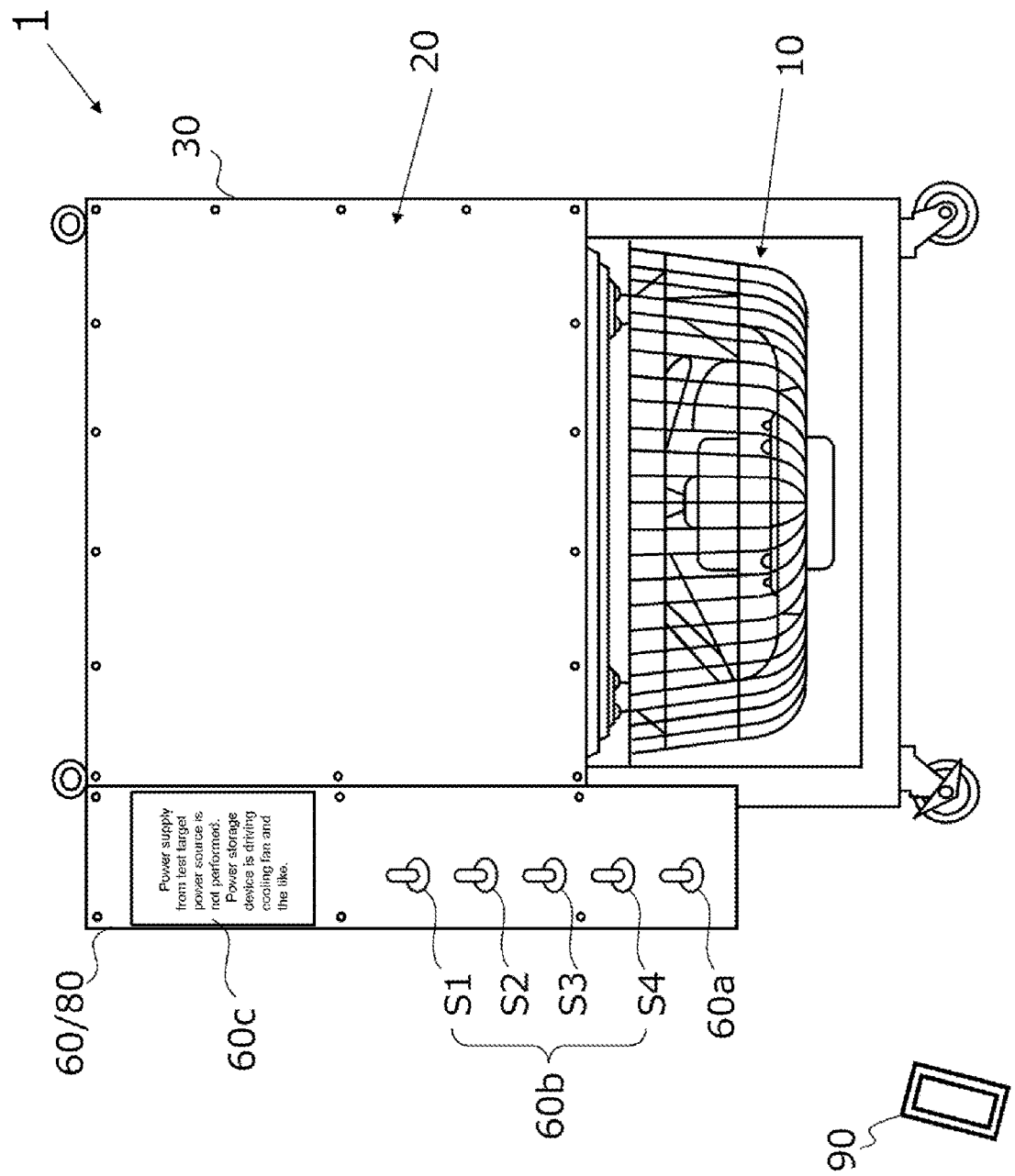
FIG. 6 is a side view of a low-voltage load testing device in the first embodiment.
Figure 7:
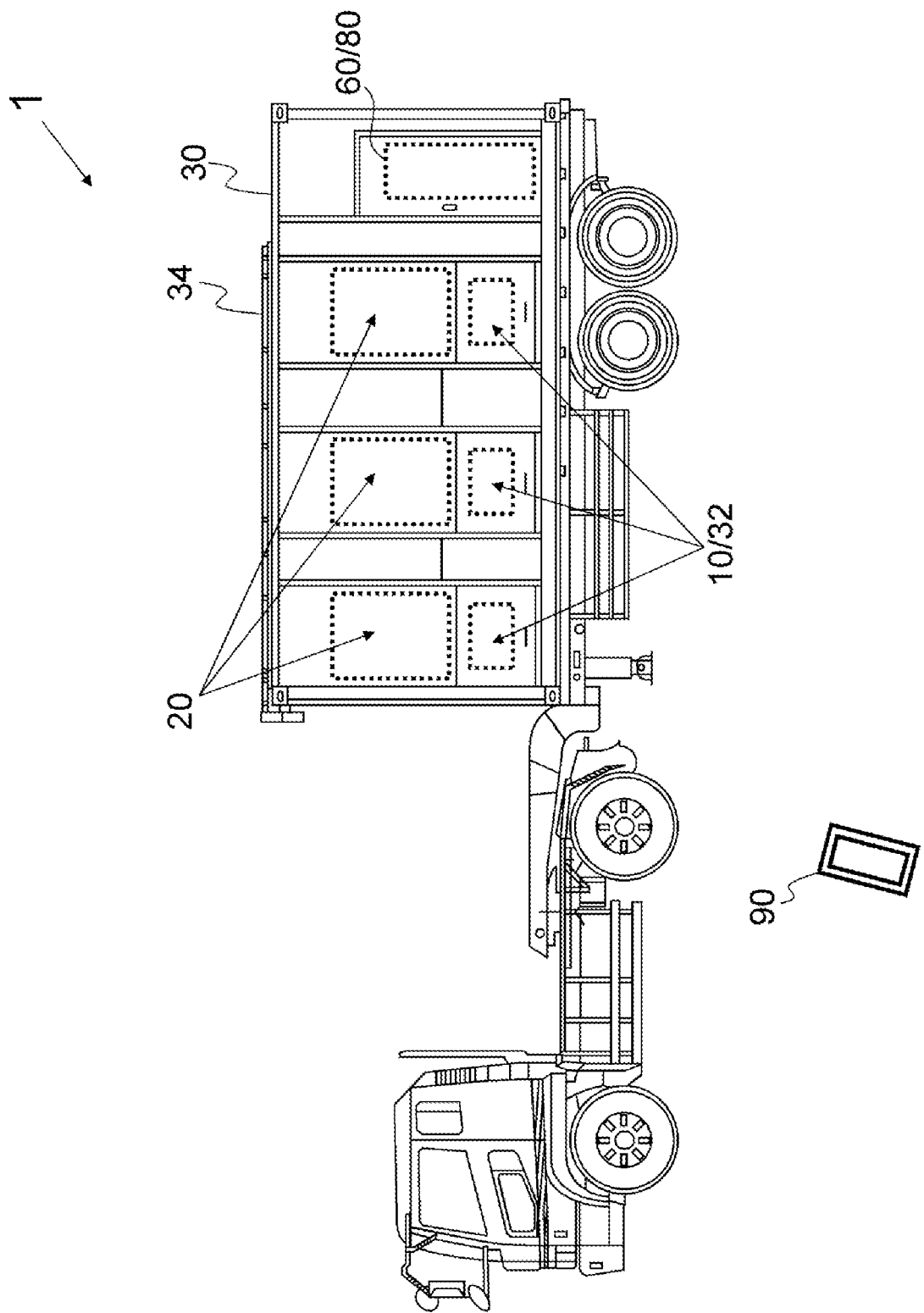
FIG. 7 is a side view of a high-voltage load testing device in the first embodiment.

The load testing device 1 in the first embodiment can be applied to a low-voltage load testing device compatible with a low-voltage power source as shown in FIG. 6, or can be applied to a high-voltage load testing device compatible with a high-voltage power source as shown in FIG. 7.

Figure 8:
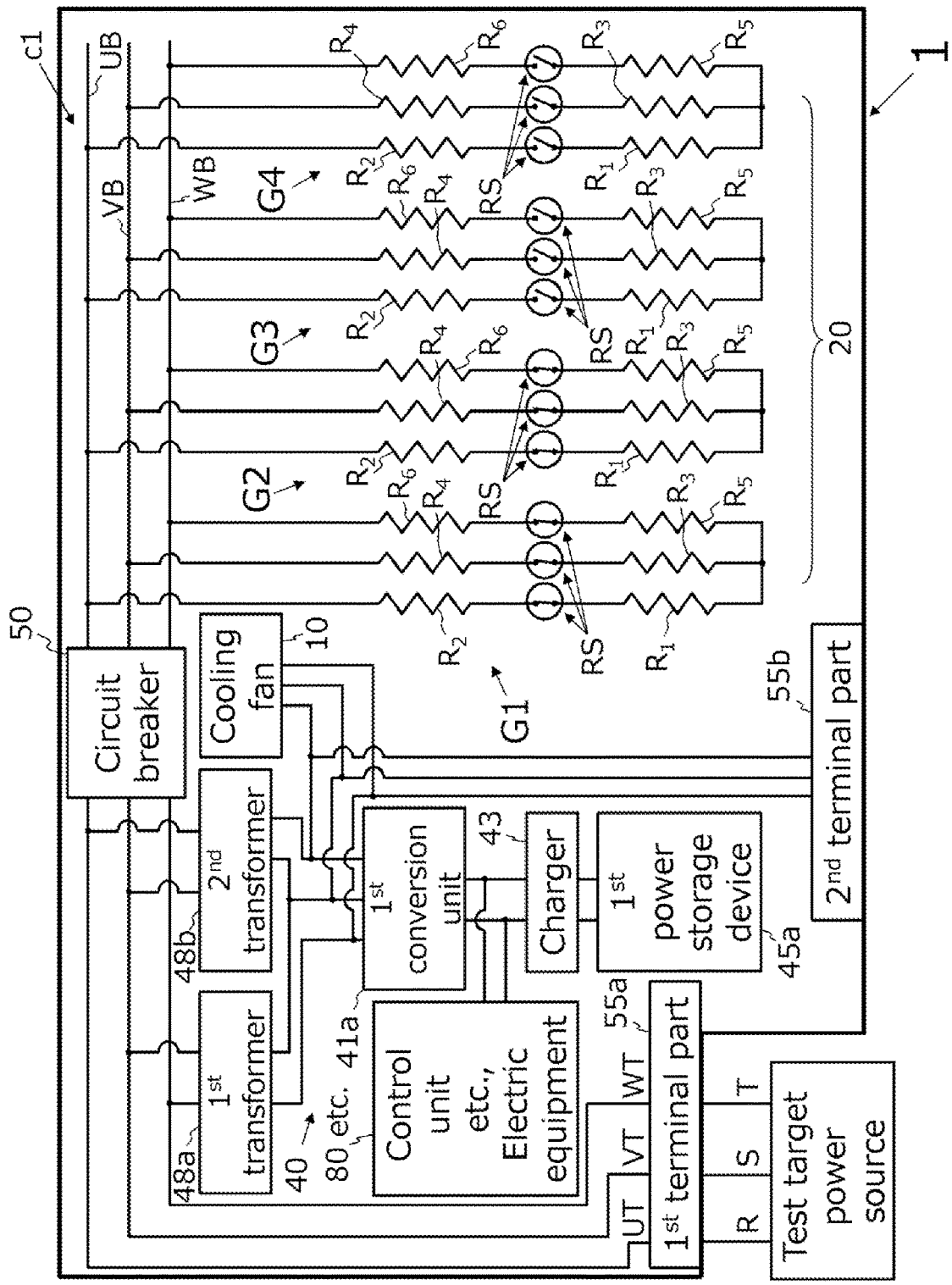
FIG. 8 is a schematic view showing a detail of the circuit configuration of the charge/discharge unit and the resistance unit, including a first transformer in the first embodiment.

When applied to a high-voltage load testing device, as shown in FIG. 8, the charge/discharge unit 40 of the load testing device 1 has a first transformer 48a and a second transformer 48b.

One terminal on the input side of the first transformer 48a is connected to the V-phase line VB, and the other terminal on the input side of the first transformer 48a is connected to the W-phase line WB.

One terminal on the input side of the second transformer 48b is connected to the U-phase line UB, and the other terminal on the input side of the second transformer 48b is connected to the V-phase line VB.

Power supply from the test target power source to the cooling fan 10, the first conversion unit 41a, and the second terminal part 55b is performed based on electric power stepped down by the first transformer 48a and the second transformer 48b.

This makes it possible to conduct a load test using the cooling fan 10 and the like that is not compatible with a high-voltage power source, in the high-voltage load testing device 1.

(Second Embodiment, Switching Use of Plurality of Power Storage Devices)

While the first embodiment shows an example of use of one power storage device (the first power storage device 45a), the second embodiment uses two power storage devices (the first power storage device 45a and a second power storage device 45b).

For this reason, the charge/discharge unit 40 in the second embodiment further includes, in addition to the first conversion unit 41a, the charger 43, and the first power storage device 45a, the second conversion unit 41b, the second power storage device 45b, a first switching relay 46a, a second switching relay 46b, and a third switching relay 46c, and is provided with a load resistance 57 connected to the first switching relay 46a.

Hereinafter, differences from the first embodiment will be mainly described.

(Cooling Fan 10 of Second Embodiment)

The cooling fan 10 is a device that supplies cooling air to the resistance unit 20, the charge/discharge unit 40, and the load resistance 57. The resistance unit 20, the charge/discharge unit 40, and the load resistance 57 are provided on a flow path through which cooling air from the cooling fan 10 passes.

(Charge/Discharge Unit 40 of Second Embodiment)

The first conversion unit 41a in the second embodiment functions as an AC/DC converter, and converts the electric power supplied from the test target power source from alternating current to direct current.

The input side of the first conversion unit 41a is connected to the U-phase line UB, the V-phase line VB, and the WB-phase line WB via the first switching relay 46a, between the first terminal part 55a and the circuit breaker 50.

The output side of the first conversion unit 41a is connected to the charger 43.

The second conversion unit 41b functions as a DC/AC inverter, and converts the electric power supplied from the first power storage device 45a or the second power storage device 45b from direct current to alternating current.

The input side of the second conversion unit 41b is connected to the first power storage device 45a and the second power storage device 45b via the third switching relay 46c.

The output side of the second conversion unit 41b is connected to the cooling fan 10 and the second terminal part 55b.

In the second embodiment, the description will be made on an assumption that the cooling fan 10 is driven by alternating current. In this case, the second conversion unit 41b connected to the cooling fan 10 includes a DC/AC converter.

However, the cooling fan 10 may be driven by direct current. In this case, the second conversion unit 41b connected to the cooling fan 10 includes a DC/DC converter or omitted.

The charger 43 has a charge circuit that charges the first power storage device 45a or the second power storage device 45b.

The first power storage device 45a and the second power storage device 45b are devices that store electric power, such as a battery.

The first power storage device 45a and the second power storage device 45b are connected to the charger 43 via the second switching relay 46b.

The first power storage device 45a and the second power storage device 45b are connected via the third switching relay 46c to the second conversion unit 41b and the electric equipment constituting the load testing device 1 such as the operation unit 60 and the control unit 80.

It is desirable that the first power storage device 45a and the second power storage device 45b have a power storage capacity capable of power supply to the cooling fan 10, the second conversion unit 41b, and electric equipment constituting the load testing device 1 such as the operation unit 60 and the control unit 80, during one load test.

The first switching relay 46a is used for switching the supply destination of electric power from the test target power source between the first conversion unit 41a (charger 43) and the load resistance 57.

Figure 9:
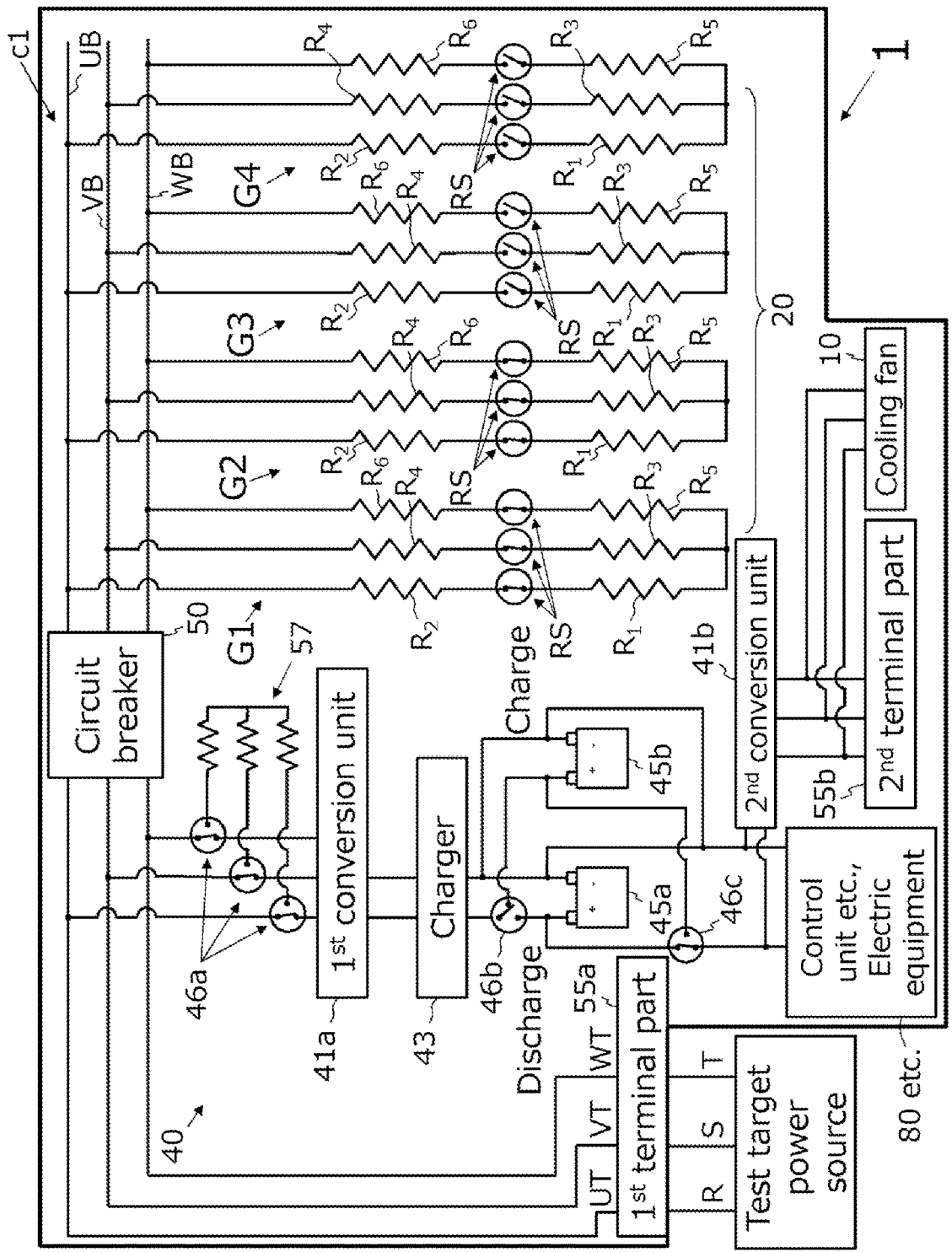
FIG. 9 is a schematic view showing a detail of the circuit configuration of the charge/discharge unit and the resistance unit in a second embodiment in which a first power storage device is in a discharge state and a second power storage device is in a charge state.
Figure 11:
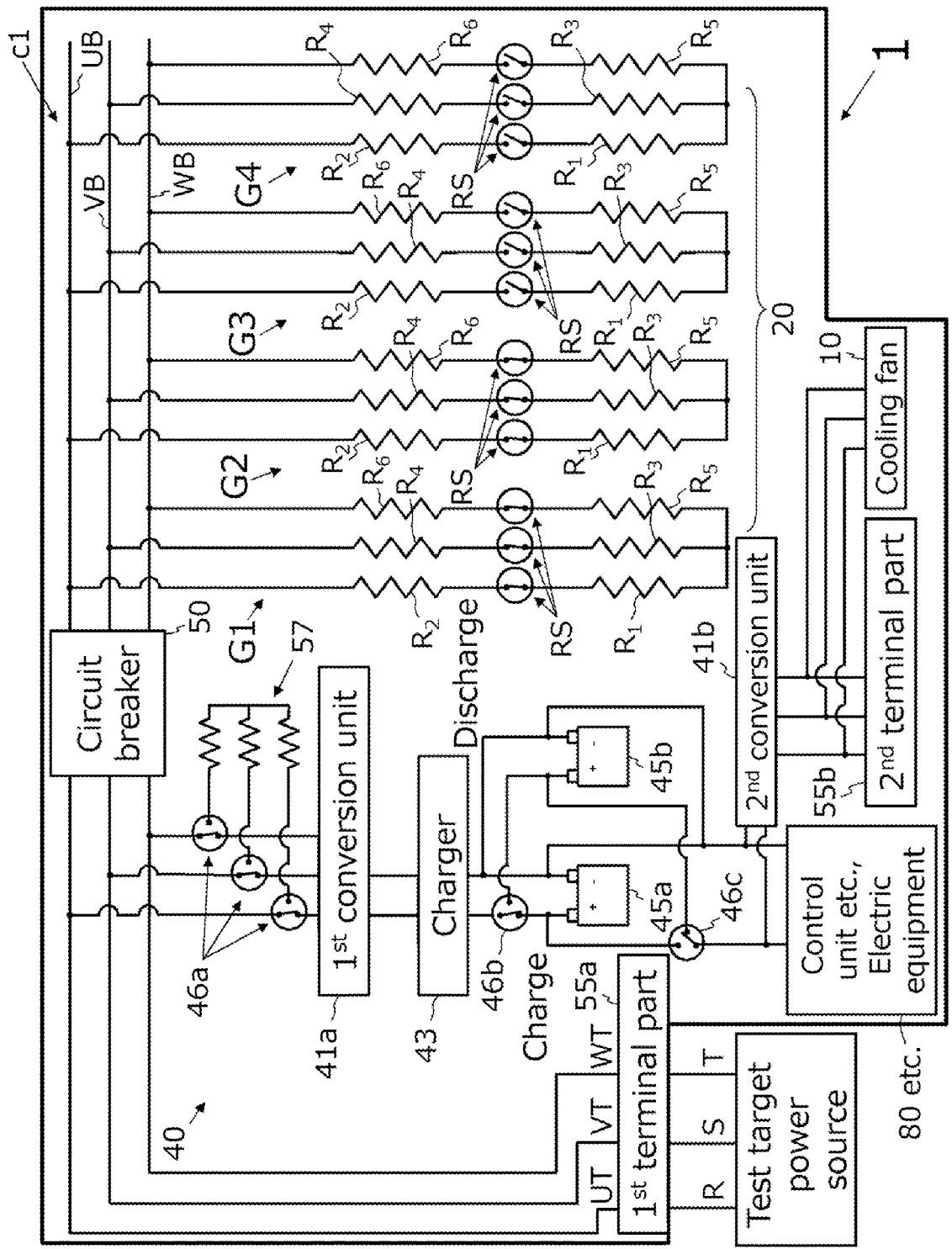
FIG. 11 is a schematic view showing a detail of the circuit configuration of the charge/discharge unit and the resistance unit in the second embodiment in which the first power storage device is in the charge state and the second power storage device is in the discharge state.

When it is necessary to charge one of the first power storage device 45a and the second power storage device 45b to which the charger 43 is connected via the second switching relay 46b, switching of the first switching relay 46a is controlled so that the first terminal part 55*a* and the first conversion unit 41*a* are electrically connected (see FIG. 9 and FIG. 11).

Figure 10:
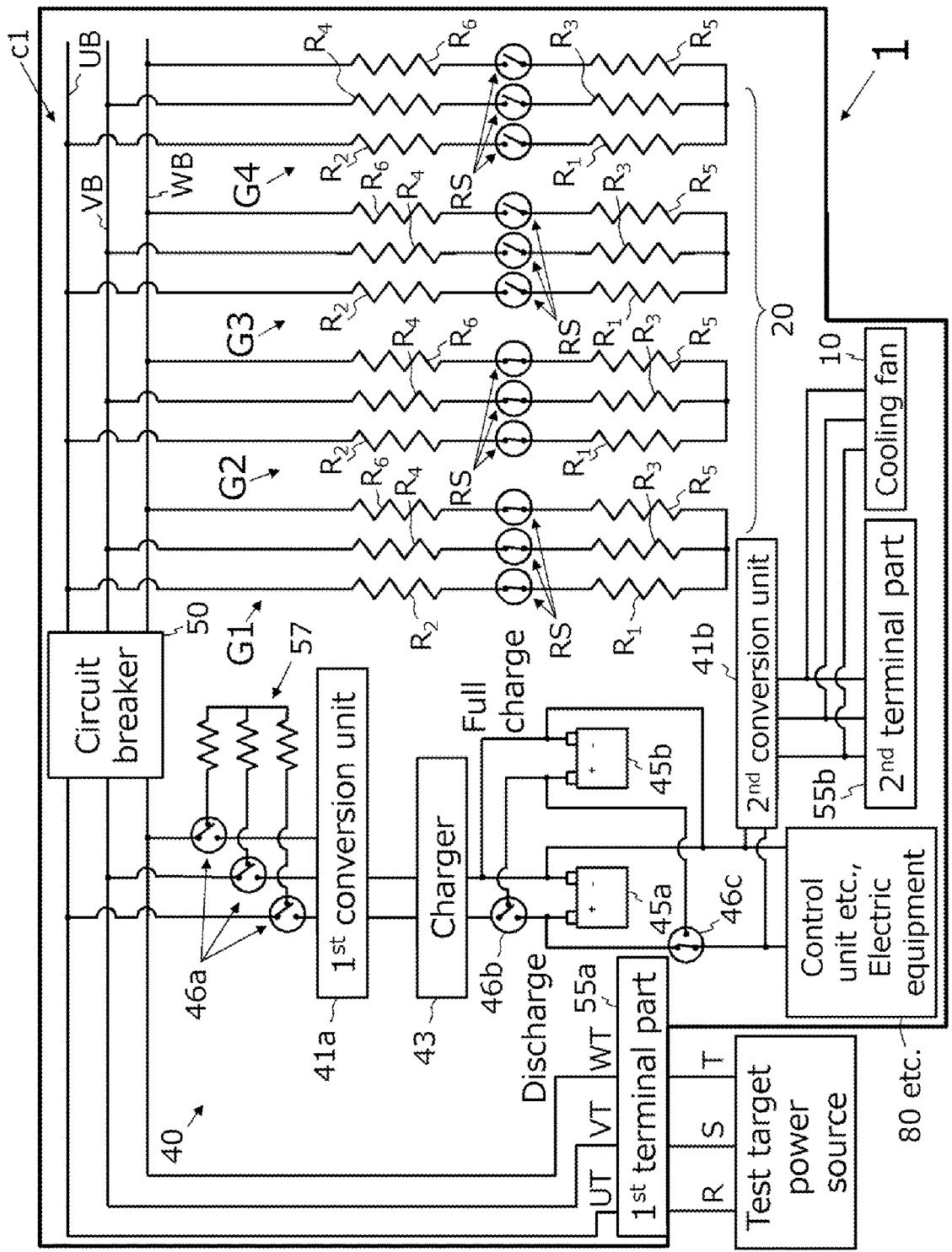
FIG. 10 is a schematic view showing a detail of the circuit configuration of the charge/discharge unit and the resistance unit in the second embodiment in which the first power storage device is in the discharge state and the second power storage device is in a full charge state.
Figure 12:
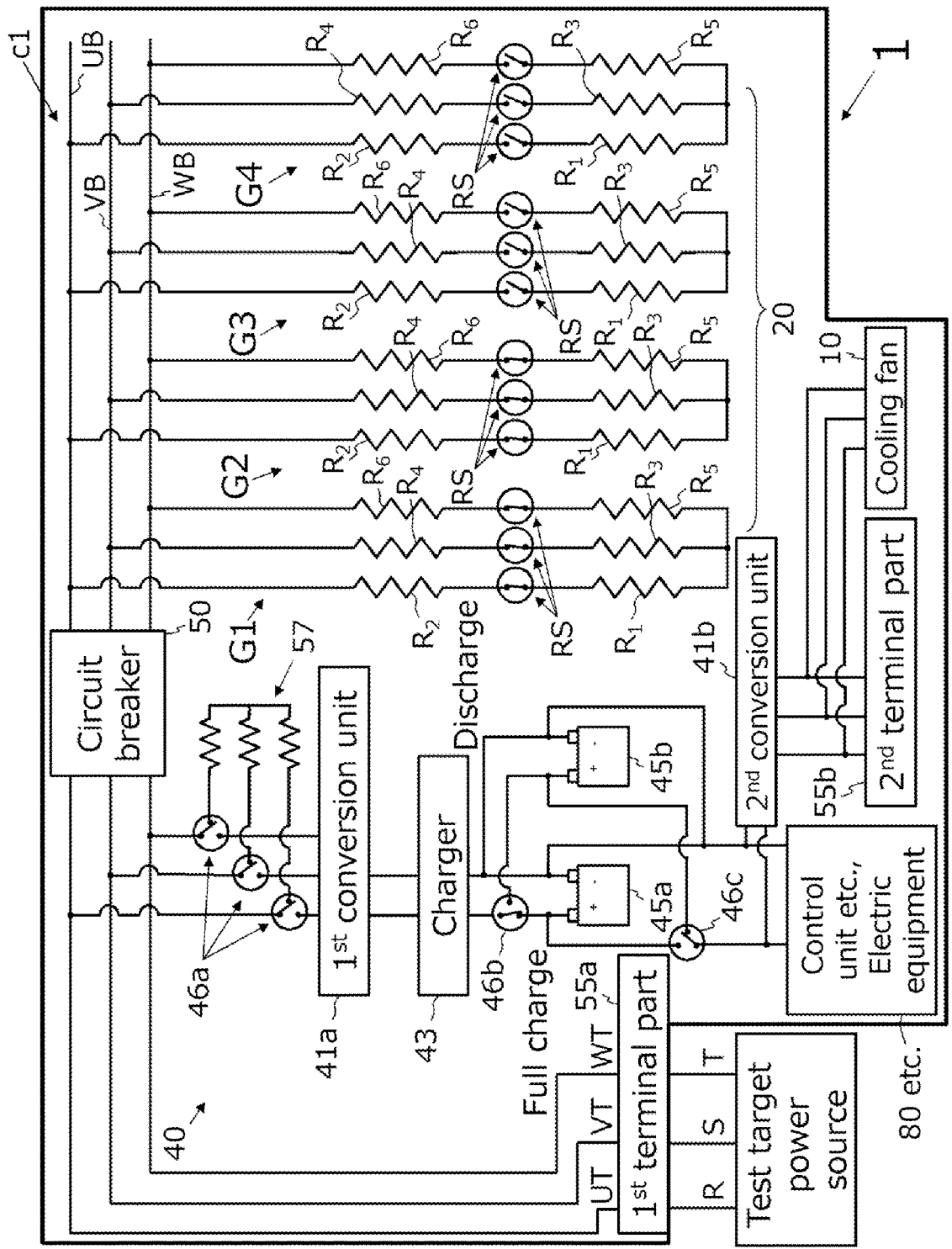
FIG. 12 is a schematic view showing a detail of the circuit configuration of the charge/discharge unit and the resistance unit in the second embodiment in which the first power storage device is in the full charge state and the second power storage device is in the discharge state.

When it is not necessary to charge, in the full charge state, one of the first power storage device 45*a* and the second power storage device 45*b* to which the charger 43 is connected via the second switching relay 46*b*, switching of the first switching relay 46*a* is controlled so that the first terminal part 55*a* and the load resistance 57 are electrically connected (see FIG. 10 and FIG. 12).

The switch control of the first switching relay 46*a* is performed by the control unit 80 based on the charge state of one of the first power storage device 45*a* and the second power storage device 45*b* to which the charger 43 is connected via the second switching relay 46*b*.

The first switching relay 46*a* may be a three-way switch in which a U-phase relay, a V-phase relay, and a W-phase relay operate on/off in an interlocking manner, or may be a single-way switch in which each relay operates on/off independently.

The "full charge state" in the first and second embodiments is not limited to one indicating a charge state of 100%, but may be one indicating a predetermined charge state of about 80 to 90%.

The second switching relay 46*b* is used for switching the supply destination of electric power from the test target power source between the first power storage device 45*a* and the second power storage device 45*b*.

When the first power storage device 45*a* supplies electric power to the cooling fan 10 and the like, switching of the second switching relay 46*b* is controlled so that the charger 43 and the second power storage device 45*b* are electrically connected.

When the second power storage device 45*b* supplies electric power to the cooling fan 10 and the like, switching of the second switching relay 46*b* is controlled so that the charger 43 and the first power storage device 45*a* are electrically connected.

The third switching relay 46*c* is used for switching the supply source of electric power to the cooling fan 10 and the like between the first power storage device 45*a* and the second power storage device 45*b*.

When the first power storage device 45*a* supplies electric power to the cooling fan 10 and the like, switching of the third switching relay 46*c* is controlled so that the cooling fan 10 and the like and the first power storage device 45*a* are electrically connected.

When the second power storage device 45*b* supplies electric power to the cooling fan 10 and the like, switching of the third switching relay 46*c* is controlled so that the cooling fan 10 and the like and the second power storage device 45*b* are electrically connected.

The second switching relay 46*b* and the third switching relay 46*c* may be switches that operate in an interlocking manner so that the second power storage device 45*b* conducts with the second conversion unit 41*b* or the like when the charger 43 conducts with the first power storage device 45*a*, and the first power storage device 45*a* conducts with the second conversion unit 41*b* or the like when the charger 43 conducts with the second power storage device 45*b*. Or the second switching relay 46*b* and the third switching relay 46*c* may be switches that operate independently of each other.

The switching control between the second switching relay 46*b* and the third switching relay 46*c* is performed by the control unit 80 based on the operation state of the load testing device 1 and the charge states of the first power storage device 45*a* and the second power storage device 45*b*.

More specifically, as shown in FIG. 9 and FIG. 10, when a load test is being conducted in a state where the first power storage device 45*a* is connected to the second conversion unit 41*b* and the like via the third switching relay 46*c* and the second power storage device 45*b* is connected to the charger 43 via the second switching relay 46*b*, switch control of the second switching relay 46*b* and the third switching relay 46*c* is performed as shown below. The second power storage device 45*b* is connected to the second conversion unit 41*b* and the like via the third switching relay 46*c*, and the first power storage device 45*a* is connected to the charger 43 via the second switching relay 46*b*, as shown in FIG. 11 and FIG. 12, when after said load test is finished, i.e., the on/off operation switch 60*a* is brought into the off state and the next load test is started, i.e., the on/off operation switch 60*a* is brought into the on state again.

However, as shown in FIG. 9 and FIG. 10, when a load test is being conducted in a state where the first power storage device 45*a* is connected to the second conversion unit 41*b* and the like via the third switching relay 46*c* and the second power storage device 45*b* is connected to the charger 43 via the second switching relay 46*b*, and when the first power storage device 45*a* is brought out of a charge state sufficient to be able to drive the cooling fan 10 and the like, switch control of the second switching relay 46*b* and the third switching relay 46*c* is performed as shown below. The second power storage device 45*b* is connected to the second conversion unit 41*b* and the like via the third switching relay 46*c*, and the first power storage device 45*a* is connected to the charger 43 via the second switching relay 46*b*, as shown in FIG. 11 and FIG. 12 even while the load test is being performed.

Furthermore, as shown in FIG. 11 and FIG. 12, when a load test is being conducted in a state where the second power storage device 45*b* is connected to the second conversion unit 41*b* and the like via the third switching relay 46*c* and the first power storage device 45*a* is connected to the charger 43 via the second switching relay 46*b*, switch control of the second switching relay 46*b* and the third switching relay 46*c* is performed as shown below. The first power storage device 45*a* is connected to the second conversion unit 41*b* and the like via the third switching relay 46*c*, and the second power storage device 45*b* is connected to the charger 43 via the second switching relay 46*b*, as shown in FIG. 9 and FIG. 10, when after said load test is finished, i.e., the on/off operation switch 60*a* is brought into the off state and the next load test is started, i.e., the on/off operation switch 60*a* is brought into the on state again.

However, as shown in FIG. 11 and FIG. 12, when a load test is being conducted in a state where the second power storage device 45*b* is connected to the second conversion unit 41*b* and the like via the third switching relay 46*c* and the first power storage device 45*a* is connected to the charger 43 via the second switching relay 46*b*, and when the first power storage device 45*a* is brought out of a charge state sufficient to be able to drive the cooling fan 10 and the like, switch control of the second switching relay 46*b* and the third switching relay 46*c* is performed as shown below. The first power storage device 45*a* is connected to the second conversion unit 41*b* and the like via the third switching relay 46*c*, and the second power storage device 45*b* is connected to the charger 43 via the second switching relay 46*b*, as shown in FIG. 9 and FIG. 10 even while the load test is being performed.

(Load Resistance 57 of Second Embodiment)

The load resistance 57 has a resistor connected to the U-phase line UB via the first switching relay 46a, a resistor connected to the V-phase line VB via the first switching relay 46a, and a resistor connected to the W-phase line WB via the first switching relay 46a. In the load resistance 57, the resistor connected to the U-phase line UB, the resistor connected to the V-phase line VB, and the resistor connected to the W-phase line WB are short-circuited at the other end portion.

The resistor of the load resistance 57 is configured so that a load for supplying power to the charger 43, the first conversion unit 41a, and any of the first power storage device 45a and the second power storage device 45b becomes substantially equal to a load for supplying power to the load resistance 57.

The load resistance 57 is used for maintaining a load at the same level as a load for charging any of the first power storage device 45a and the second power storage device 45b when not charging to the first power storage device 45a and the second power storage device 45b.

The resistor of the load resistance 57 is provided on a flow path through which the cooling air from the cooling fan 10 passes.

As shown in FIG. 9 to FIG. 12, the load resistance 57 is electrically connected to the test target power source cable c1 between the first terminal part 55a and the circuit breaker 50.

However, the load resistance 57 may be electrically connected to the test target power source cable c1 on the side where the resistance unit 20 of the circuit breaker 50 is present, separately from the charge/discharge unit 40.

(Display Unit 60c of Second Embodiment)

The display unit 60c outputs information regarding the operation state of the load testing device 1, for example, information regarding whether the electric power from the test target power source is supplied to the load resistance 57 or is supplied to the charger 43, and information regarding whether the cooling fan 10 is driving based on electric power from the first power storage device 45a or driving based on electric power from the second power storage device 45b.

Specifically, the display unit 60c displays, for example, "power supply from the test target power source is present and the first power storage device 45a (or the second power storage device 45b) is being charged", "power supply from the test target power source is present but the first power storage device 45a (or the second power storage device 45b) is fully charged", "power supply from the test target power source is not present and the second power storage device 45b (or the first power storage device 45a) is driving the cooling fan 10 and the like", and the like.

The operation state of the load testing device 1 and the operation state of the first power storage device 45a may not only displayed on the display unit 60c of the operation unit 60 of the load testing device 1, but may also be displayed on the mobile terminal 90 separate from the load testing device 1.

In this case, the mobile terminal 90 communicates with the control unit 80 and the like of the load testing device 1. Information regarding the operation state of the first power storage device 45a, for example, information regarding whether the electric power from the test target power source is supplied to the load resistance 57 or is supplied to the charger 43, and information regarding whether the cooling fan 10 is driving based on electric power from the first power storage device 45a or driving based on electric power from the second power storage device 45b, is transmitted to the mobile terminal 90.

(Effects)

In the second embodiment, since the load resistance 57 is provided, it is possible to make the electric load of the load testing device 1 constant between at the time of charging and at the time when it is not necessary to charge because of full charge (at the time of non-charging).

Since the cooling fan 10 is driven based on electric power supplied from the power storage device (either the first power storage device 45a or the second power storage device 45b), rather than directly based on electric power supplied from the test target power source, it is possible to reduce the possibility of the cooling fan being momentarily stopped even if the power supply from the test target power source to the load testing device 1 is stopped.

Two power storage devices (the first power storage device 45a and the second power storage device 45b) are provided. When one (the first power storage device 45a) is charged, the other (the second power storage device 45b) is discharged. When the other is charged, the one is discharged. Therefore, it is possible to reduce the load on the power storage device as compared with a form in which one power storage device performs power storage and discharge.

(Application to Single-Phase Alternating-Current or Direct-Current Test Target Power Source)

In the second embodiment, the test target power source is a three-phase alternating-current power source, but the test target power source may be a single-phase alternating-current power source or a direct-current power source.

When the test target power source is a direct-current power source, the cooling fan 10 is driven by direct current, and the first conversion unit 41a and the second conversion unit 41b are omitted.

(Application to High-Voltage Load Testing Device 1)

Similarly to the load testing device 1 in the first embodiment, the load testing device 1 in the second embodiment can be applied to a low-voltage load testing device compatible with a low-voltage power source, or can be applied to a high-voltage load testing device compatible with a high-voltage power source.

When applied to a high-voltage load testing device, similarly to the load testing device 1 in the first embodiment, the charge/discharge unit 40 of the load testing device 1 has the first transformer 48a and the second transformer 48b.

(Form Provided with Plurality of Charge/Discharge Units)

In the first and second embodiments, one cooling fan 10 and one charge/discharge unit 40 are provided, and the one cooling fan 10 cools the resistance unit 20 and the like.

Figure 13:
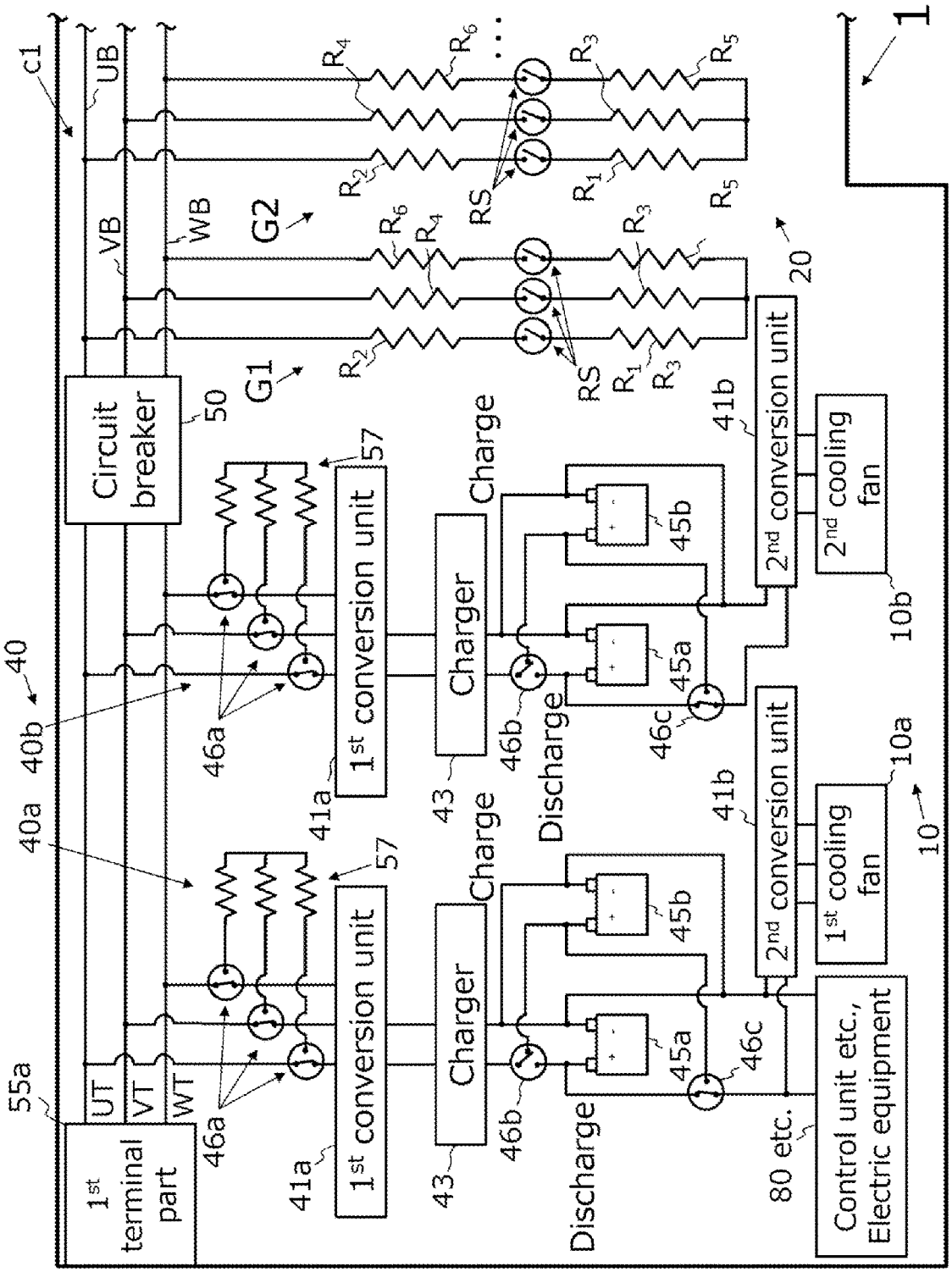
FIG. 13 is a schematic view showing an application example of the second embodiment provided with a plurality of charge/discharge units and a plurality of cooling fans.

However, a plurality of sets of the cooling fan 10 and the charge/discharge unit 40 may be provided, and the plurality of cooling fans may cool the resistance unit 20 and the like (see FIG. 13).

FIG. 13 shows an example in which two cooling fans (a first cooling fan 10a and a second cooling fan 10b) and two charge/discharge units (a first charge/discharge unit 40a and a second charge/discharge unit 40b) are provided.

FIG. 13 does not illustrate the third resistor group G3, the fourth resistor group G4, and the second terminal part 55b.

The first charge/discharge unit 40a is connected with the first cooling fan 10a and the electric equipment constituting the load testing device 1 such as the operation unit 60 and the control unit 80.

The first charge/discharge unit 40a is used as an uninterruptible device for the first cooling fan 10a and the electric equipment constituting the load testing device 1 such as the operation unit 60 and the control unit 80.

However, it is desirable that the charge/discharge unit for supplying electric power to the electric equipment constituting the load testing device 1 such as the operation unit 60 and the control unit 80 is provided separately from the first charge/discharge unit 40a. By separating the charge/discharge unit from the cooling fan 10, it is possible to make the cooling fan 10 less susceptible to the load at the time of on/off switching of the relay RS which is controlled on/off in accordance with the on/off operation of the first switch S1 to the fourth switch S4 of the operation unit 60.

The second charge/discharge unit 40a is connected to the second cooling fan 10b.

The second charge/discharge unit 40b is used as an uninterruptible device of the second cooling fan 10b.

That is, the first cooling fan 10a and the first charge/discharge unit 40a are provided as a first set, and the second cooling fan 10b and the second charge/discharge unit 40b are provided as a second set.

The first cooling fan 10a supplies cooling air to the resistance unit 20 and the first charge/discharge unit 40a.

The second cooling fan 10b supplies cooling air to the resistance unit 20 and the second charge/discharge unit 40b.

That is, cooling air from the first cooling fan 10a and the second cooling fan 10b is supplied to the resistance unit 20.

Since the resistance unit 20 is cooled by the plurality of cooling fans, a smaller cooling fan can be used for each of said plurality of cooling fans as compared with a form in which the resistance unit 20 is cooled by one cooling fan.

A plurality of charge/discharge units is provided corresponding to the plurality of small cooling fans.

Therefore, it is possible to use a power storage device and a charger having a smaller capacity for each of said plurality of charge/discharge units as compared with a form in which a plurality of cooling fans is driven by one charge/discharge unit.

The use of a small-capacity power storage device and charger makes it possible to complete charging and discharging in a shorter time as compared with a form in which a large-capacity power storage device and a charger are used.

The cooling fan 10 may be controlled in accordance with the state (load amount, temperature, and the like) of the resistance unit 20.

For example, when the temperature of the resistance unit 20 is lower than a temperature threshold value and a load amount is relatively small, only one of the first cooling fan 10a and the second cooling fan 10b is driven. When the temperature of the resistance unit 20 is equal to or higher than the temperature threshold value and the load amount is relatively large, both of the first cooling fan 10a and the second cooling fan 10b are driven.

The control of the cooling fan 10 is not limited to the on/off control of the plurality of cooling fans. For example, it is conceivable a form in which the rotational speed of the cooling fan 10 is controlled using an inverter (not illustrated) provided in the second conversion unit 41b or provided between the second conversion unit 41b and the cooling fan 10.

Although some embodiments of the present invention have been described, these embodiments are presented by way of example and are not intended to limit the scope of the invention. These embodiments can be implemented in various other forms, and various omissions, substitutions, and changes can be made without departing from the gist of the invention. These embodiments and modifications thereof are included in the scope and gist of the invention, and included in the scope of the invention described in the claims and the equivalent scope thereof.

REFERENCE SIGNS LIST

1 Load testing device
10 Cooling fan
10a First cooling fan
10b Second cooling fan
20 Resistance unit
30 Housing
31 Intake port
32 Intake lid
33 Exhaust port
34 Exhaust lid
40 Charge/discharge unit
40a First charge/discharge unit
40b Second charge/discharge unit
41a First conversion unit
41b Second conversion unit
43 Charger
45a First power storage device
45b Second power storage device
46a First switching relay
46b Second switching relay
46c Third switching relay
48a First transformer
48b Second transformer
50 Circuit breaker
55a First terminal part
55b Second terminal part
57 Load resistance
60 Operation unit
60a On/off operation switch
60b Selection switch
60c Display unit
80 Control unit
90 Mobile terminal
c1 Test target power source cable
G1 First resistor group
G2 Second resistor group
G3 Third resistor group
G4 Fourth resistor group
$R_1$ First resistor
$R_2$ Second resistor
$R_3$ Third resistor
$R_4$ Fourth resistor
$R_5$ Fifth resistor
$R_6$ Sixth resistor
RS Relay
S1 First switch
S2 Second switch
S3 Third switch
S4 Fourth switch
UT U-phase terminal
UB U-phase line
VT V-phase terminal
VB V-phase line
WT W-phase terminal
WB W-phase line

The invention claimed is:
1. A load testing device comprising:
a resistance unit;
a cooling fan that cools the resistance unit;
a circuit breaker;

a first terminal part that is connected to a test target power source; and a charge/discharge unit that has a charger and a first power storage device, wherein the charge/discharge unit is connected with a test target power source cable being between the first terminal part and the resistance unit, between the first terminal part and the circuit breaker, the first power storage device stores electric power supplied from the test target power source, the cooling fan is driven based on electric power from at least one of the test target power source and the charge/discharge unit, the load testing device further comprises a second terminal part that is connected to an external device separate from the load testing device, and the external device connected to the second terminal part is driven based on electric power from the first power storage device via the charger when the cooling fan is in an off state.

2. The load testing device according to claim 1, further comprising one or more cooling fans; and one or more charge/discharge units provided for use as uninterruptible devices for the one or more cooling fans and for supplying electric power to the one or more cooling fans, wherein the cooling fan and the one or more cooling fans cool the resistance unit.

3. The load testing device according to claim 2, wherein the cooling fan and the one or more cooling fans are controlled in accordance with a state of the resistance unit.

4. A load testing device comprising:

a resistance unit;

a cooling fan that cools the resistance unit;

a circuit breaker;

a first terminal part that is connected to a test target power source; and a charge/discharge unit that has a charger and a first power storage device, wherein the charge/discharge unit is connected with a test target power source cable being between the first terminal part and the resistance unit, between the first terminal part and the circuit breaker, the first power storage device stores electric power supplied from the test target power source, the cooling fan is driven based on electric power from at least one of the test target power source and the charge/discharge unit, the load testing device further comprises a display unit, and the display unit outputs information regarding whether the cooling fan is driving based on electric power from the test target power source or driving based on electric power from the charge/discharge unit.

5. A load testing device comprising:

a resistance unit;

a cooling fan that cools the resistance unit;

a circuit breaker;

a first terminal part that is connected to a test target power source; and a charge/discharge unit that has a charger and a first power storage device, wherein the charge/discharge unit is connected with a test target power source cable being between the first terminal part and the resistance unit, between the first terminal part and the circuit breaker, the first power storage device stores electric power supplied from the test target power source, the cooling fan is driven based on electric power from at least one of the test target power source and the charge/discharge unit, and information regarding whether the cooling fan is driving based on electric power from the test target power source or driving based on electric power from the charge/discharge unit is transmitted to a mobile terminal separate from the load testing device.

6. A load testing device comprising:

a resistance unit;

a cooling fan that cools the resistance unit;

a circuit breaker;

a first terminal part that is connected to a test target power source;

a charge/discharge unit that has a charger and a first power storage device; and a load resistance, wherein the charge/discharge unit is connected with a test target power source cable being between the first terminal part and the resistance unit, between the first terminal part and the circuit breaker, the first power storage device stores electric power supplied from the test target power source, the cooling fan is driven based on electric power from the charge/discharge unit, the charge/discharge unit has a first switching relay, the first switching relay is used for switching a supply destination of electric power from the test target power source between the charger and the load resistance, the charge/discharge unit has a second power storage device, a second switching relay, and a third switching relay, the second power storage device stores electric power supplied from the test target power source, the second switching relay is used for switching a supply destination of electric power from the test target power source between the first power storage device and the second power storage device, and the third switching relay is used for switching whether electric power to the cooling fan is supplied from the first power storage device or supplied from the second power storage device.

7. The load testing device according to claim 6 further comprising:

a display unit, wherein the display unit outputs information regarding whether electric power from the test target power source is supplied to the load resistance or supplied to the charger, and information regarding whether the cooling fan is driving based on electric power from the first power storage device or driving based on electric power from the second power storage device.

8. The load testing device according to claim 6, wherein information regarding whether electric power from the test target power source is supplied to the load resistance or supplied to the charger, and information regarding whether the cooling fan is driving based on electric power from the first power storage device or driving based on electric power from the second power storage device are transmitted to a mobile terminal separate from the load testing device.

* * * * *